United States Patent
Frisa et al.

[11] Patent Number: 5,961,791
[45] Date of Patent: Oct. 5, 1999

[54] PROCESS FOR FABRICATING A SEMICONDUCTOR DEVICE

[75] Inventors: Larry E. Frisa, Cedar Park; Hak-Lay Chuang; Laura Pressley, both of Austin, all of Tex.

[73] Assignee: Motorola, Inc., Schaumburg, Ill.

[21] Appl. No.: 08/804,589

[22] Filed: Feb. 26, 1997

[51] Int. Cl.$^6$ .................................................. C23C 14/34
[52] U.S. Cl. ................................ 204/192.1; 204/192.15; 204/192.17; 438/627; 438/643; 438/648; 438/653; 438/656; 438/970
[58] Field of Search .......................... 204/192.1, 192.15, 204/192.17, 192.27, 192.25; 438/970, 627, 643, 648, 653, 656

[56] References Cited

U.S. PATENT DOCUMENTS

| | | | |
|---|---|---|---|
| 4,474,829 | 10/1984 | Peters | 427/53.1 |
| 4,717,681 | 1/1988 | Curran | 437/31 |
| 5,206,187 | 4/1993 | Doan et al. | 437/192 |
| 5,231,053 | 7/1993 | Bost et al. | 437/190 |
| 5,240,880 | 8/1993 | Hindman et al. | 437/190 |
| 5,248,632 | 9/1993 | Tung et al. | 437/195 |
| 5,275,715 | 1/1994 | Tuttle | 205/123 |
| 5,289,035 | 2/1994 | Bost et al. | 257/750 |
| 5,323,047 | 6/1994 | Nguyen | 257/384 |
| 5,391,517 | 2/1995 | Gelatos et al. | 437/190 |
| 5,420,072 | 5/1995 | Fiordalice et al. | 437/192 |
| 5,427,666 | 6/1995 | Mueller et al. | 204/192.17 |
| 5,468,339 | 11/1995 | Gupta et al. | 316/37 |
| 5,614,437 | 3/1997 | Chouldhury | 437/140 |
| 5,677,238 | 10/1997 | Gn et al. | 437/194 |
| 5,747,360 | 5/1998 | Nulman | 437/189 |

FOREIGN PATENT DOCUMENTS

| | | |
|---|---|---|
| 0 163 830 A2 | 3/1985 | European Pat. Off. ........ H01L 23/52 |
| 0 673 063 A2 | 9/1995 | European Pat. Off. ...... H01L 21/768 |
| 7-297281 | 11/1995 | Japan . |

OTHER PUBLICATIONS

Han Sin Lee et al., "An Optimized Densification of the Filled Oxide for Quarter Micron Shallow Trench Isolation (STI)", 1996 IEEE Symposium on VLSI Technology Digest of Tech. Papers, pp. 158–159.

J. Torres, "Advanced copper interconnections for silicon CMOS technologies", 1995 Elsevier Science B.V., pp. 112–123.

Shi–Qing Wang, "Barriers Against Copper Diffusion into Silicon and Drift Through Silicon Dioxide", Aug., 1994 MRS Bulletin, pp. 30–39.

J.S. Reid et al., "Evaluation of amorphous (Mo, Ta, W)—Si–N diffusion barriers for <Si>/Cu metallizations", 1993 Elsevier Sequoia, pp. 319–324.

Wen–Chun Wang et al., "Diffusion barrier study on TaSi$_x$ and TaSi$_x$N$_y$", 1993 Elsevier Sequoia, pp. 169–174.

G. Smolinsky et al., "Material Properties of Spin–on Silicon Oxide (SOX) for Fully Recessed NMOS Field Isolation", J. Electrochem. Soc., vol. 137, No. 1, Jan. 1990, pp. 229–234.

(List continued on next page.)

*Primary Examiner*—Nam Nguyen
*Assistant Examiner*—S. Ver Steeg

[57] ABSTRACT

A via 42 is formed in an ILD layer 40 of a semiconductor device 30, using an etch chemistry which is highly selective to an underlying transition metal oxy-nitride film 38. In one form, film 38 is a TiO$_x$N$_y$ film which is graded in nitrogen and oxygen concentration, being nitrogen rich at the bottom and oxygen reach at the top of the film. One method for forming TiO$_x$N$_y$ is to sputter deposit a titantium layer 34 onto the semiconductor device using a titanium target 52. Using the same target, a TiN layer 36 is deposited by flowing nitrogen into the deposition chamber. Consequently, a TiN layer 58 is deposited onto target 52. The TiN layer 58 is then sputtered off the target onto the semiconductor device until eventually pure titanium is again being sputtered onto the device. The resulting deposited film has a grade titanium concentration, which is then oxidized to form the graded TiO$_x$N$_y$ film.

40 Claims, 4 Drawing Sheets

OTHER PUBLICATIONS

Stanley Wolf Ph.D., "Silicon Processing for the VLSI Era vol. 2: Process Integration", Lattice Press, California, pp. 274–276.

IBM, "Selective Oxidation of Titanium While Forming Titanium Silicide at Polysilicon and Diffusions", IBM Technical Disclosure Bulletin, vol. 27, No. 10A, pp. 5870–5875 (1985).

Derwent 1996–025509.

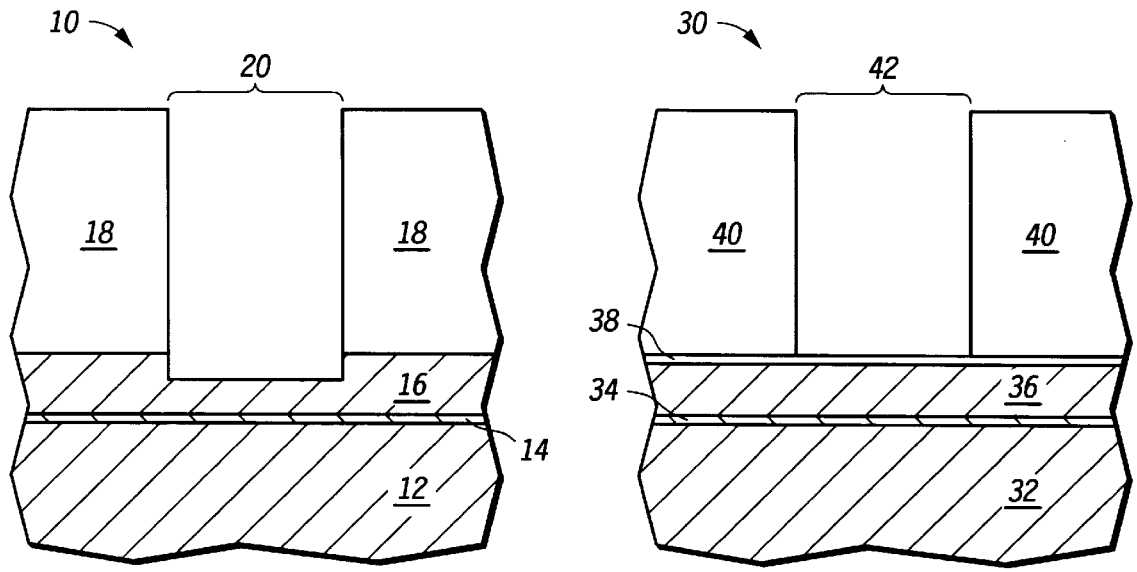
FIG.1
-PRIOR ART-
FIG.2
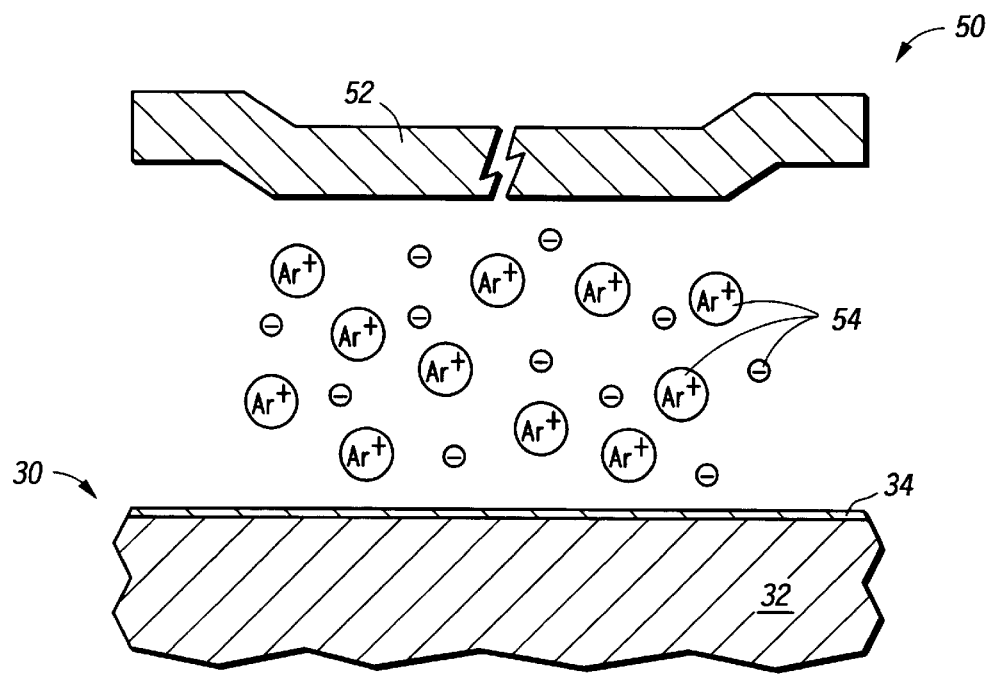
FIG.3

5,961,791

PROCESS FOR FABRICATING A SEMICONDUCTOR DEVICE

FIELD OF THE INVENTION

The present invention relates generally to methods for making semiconductor devices, and more particularly to methods for forming vias in semiconductor devices.

BACKGROUND OF THE INVENTION

Vias are used in semiconductor manufacturing to connect one level of metallization to an underlying level of metallization. Separating the layers of metal is typically an interlayer dielectric (ILD) which is typically formed of silicon dioxide. In forming a via, an anisotropic etch is performed through the ILD layer to expose an area of the underlying metal. In forming the vias through an ILD layer, the ILD thickness varies considerably across individual wafers and from wafer to wafer and lot to lot. Accordingly, to expose the underlying metallization layer, everywhere, most semiconductor manufacturers perform an overetch of the ILD layer. In other words, the etch of the ILD layer is performed longer than would be required for certain thickness, in an effort to remove the thickest portions of the ILD layer.

FIG. 1 illustrates a portion of a semiconductor device 10 which illustrates the problems associated with over etching the ILD layer. Within device 10 is an underlying metallization layer 12, which is typically in the form of aluminum or an aluminum alloy. Deposited on top of the aluminum layer is a titanium (Ti) layer 14 and a titanium nitride (TiN) layer 16. Titanium nitride layer 16 serves as an anti-reflective coating (ARC) to aid in the photo lithography process, as is conventionally known. Titanium layer 14 serves as a barrier layer, and lowers the contact resistant in a via which is made to underlying metallization layer 12. Over the metallization stack is formed an ILD layer 18. In a preferred embodiment ILD layer 18 is plasma deposited silicon dioxide. As shown, ILD layer 18 has a planar top surface as a result of chemical mechanical polishing (CMP), as is well known in the prior art. After polishing back ILD layer 18, semiconductor device 10 is patterned and etched to form a via 20 through the ILD layer. In one prior art method, via 20 is formed using a chemistry of $CHF_3$ and argon either with or without $CF_4$. With such a chemistry, the ratio of the etch rates between ILD layer 18 and titanium nitride layer 16 is approximately between 10:1 and 15:1. However, such etch rate selectivity is insufficient given that ILD layer 18 can vary in thickness from about 70–80% (i.e. 10,000 angstroms (Å) to 17,000 Å). With such a variation in ILD thickness and such etch rate selectivity, it is impossible to guarantee that the via etch stops somewhere between TiN layer 16 and Ti layer 14. It is very important that the via etch stops between these layers, for exposure of the underlying metallization layer 12, typically in the form of aluminum, is detrimental to subsequent plug formation within via 20. More particularly, conventional practices are to deposit a TiN glue layer within via 20. When aluminum is exposed at the bottom of via 20, nitrogen will react with the aluminum to form aluminum nitride which is undesirable because it will increase the resistance of the contact. Lining via 20 with titanium prior to depositing titanium nitride may prohibit the formation of aluminum nitride. However, any exposed titanium will undesirably react with $WF_6$, a chemical commonly used to form tungsten plugs within via 20.

One method to assure that the via etch stops before exposing the underlying aluminum metallization is to use an etch chemistry which is highly selective to titanium nitride. A few chemistries have been proposed, for example helium has been added to the conventional $CHF_3$ and argon etch process to improve etch selectivity to about 21:1. However, this too is insufficient given the varying thickness of ILD layer 18 across the wafer and from wafer to wafer and lot to lot. Other selective chemistries are $C_4F_8$ or $C_3F_8$ based chemistries which are more selective to TiN. However, use of these chemistries suffers from the disadvantage that throughput of wafers is relatively low. For example, a typical etch time using these chemistries is 10 minutes per wafer while using a $CHF_3$ base chemistries is on the order of 4 minutes per wafer. Furthermore, use of $C_4F_8$ and $C_3F_8$ based chemistries are less reliable processes. In some instances, the etching of ILD layer 18 will stop without having cleared the underlying metallization due to uncontrolled polymer deposition.

Therefore, there is a need for a new process to be able to etch vias within semiconductor devices without exposing the underlying aluminum metallization, while clearing the ILD layer in the vias despite variations in the ILD thickness. Furthermore, it is desirable that such a process is performed without degrading wafer throughput in the factory.

BRIEF DESCRIPTION OF THE DRAWINGS

FIG. 1 is a partial cross-sectional view of a semiconductor device formed in accordance with the prior art.

FIG. 2 is a partial cross-sectional view of a semiconductor device having a via formed in accordance with the present invention.

FIGS. 3–6 illustrate, in sequence, how the metallization stack of the semiconductor device of FIG. 2 is formed in accordance with one embodiment of the present invention.

DETAILED DESCRIPTION OF A PREFERRED EMBODIMENT

Figure 4:
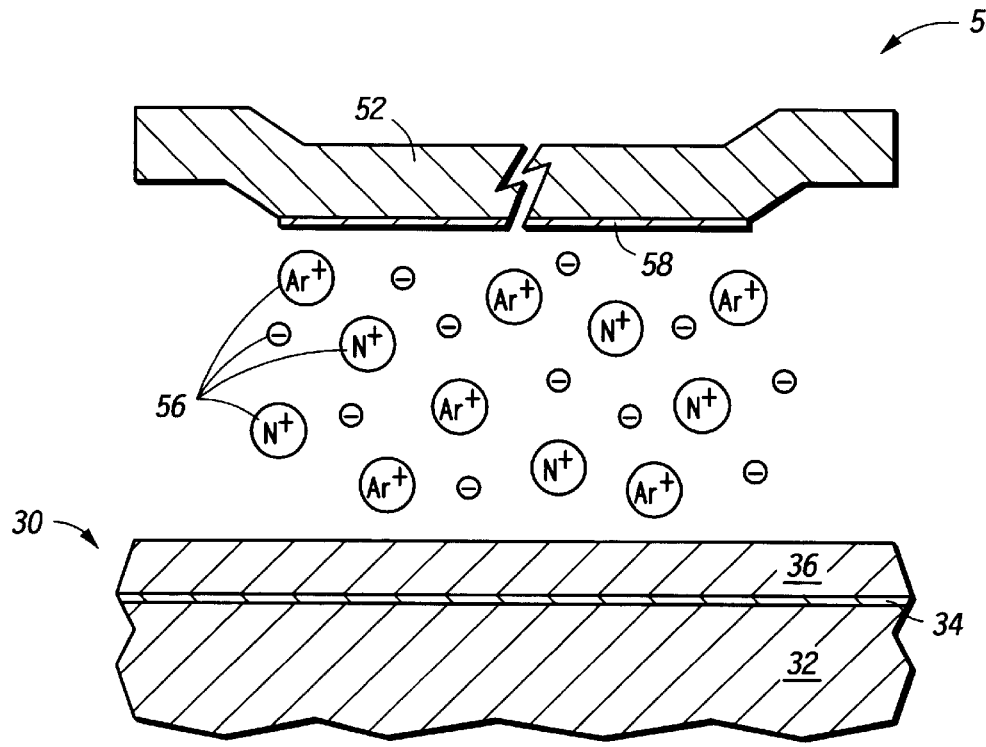

Generally, the present invention provides a method for forming vias in a semiconductor device which utilizes a titanium oxy-nitride ($TiO_xN_y$) film as an etch-stop layer for a via etch. In accordance with one embodiment of the invention, on top of the traditional titanium and titanium nitride films deposited on aluminum, a graded film containing titanium, oxygen and nitrogen is formed on the surface of the titanium nitride layer. The $TiO_xN_y$ film is graded in oxygen and nitrogen concentration from the bottom to the top of the film, being nitrogen rich near the bottom of the film and oxygen rich near the top of the film. In one embodiment the $TiO_xN_y$ film is formed by sputter depositing a titanium nitride layer which is formed on a titanium target in a sputter deposition tool. After removing the titanium nitride layer of the target, pure titanium is deposited, and this titanium is converted to titanium oxide using a downstream $O_2$ plasma ash. Oxidizing titanium in the film serves two purposes: (1) to form a film which can be used as an etch-stop during the via etch process and (2) to serve as an ARC for patterning the underlying metallization layer. By forming a titanium oxy-nitride film, an interlayer dielectric film can be etched, stopping on or in the titanium oxy-nitride with greater etch selectivity to $SiO_2$ or TiN alone.

Accordingly, variations in the interlayer dielectric thickness can be handled using an overetch, without concern that the underlying aluminum layer may be exposed during the overetch. By using a titanium oxy-nitride layer in conjunction with the present invention, the traditional TiN ARC layer can be made thinner. Furthermore, in one embodiment of the present invention, formation of the titanium oxy-nitride layer increases throughput in a sputter deposition system by eliminating the need to use a shutter disk. Yet another advantage is that the titanium oxy-nitride formed at the bottom of the via can be removed in a conventional via glue layer pre-clean step which is already used in the manufacturing process.

These and other features and advantages can be more clearly understood from the following detailed description taken in conjunction with the following drawings. It is important to point out that the illustrations are not necessarily drawn to scale, and there are likely to be other embodiments of the invention which are not specifically illustrated. For simplicity and clarity reasons, reference numerals are sometimes used throughout the various views to note identical or similar elements.

FIG. 2 illustrates, in a cross-sectional view, a portion of a semiconductor device 30 formed in accordance with one embodiment of the present invention. Device 30 includes an underlying metallization layer 32 which is typically an aluminum or an aluminum alloy, but is not limited to these materials. For example, the underlying metallization may be copper or a copper alloy. Overlying metallization 32 is a titanium layer 34 and a titanium nitride layer 36 as was formed in prior art semiconductor devices. In accordance with the invention, a $TiO_xN_y$ layer 38 is formed on top of titanium nitride layer 36. The method in which $TiO_xN_y$ layer 38 is formed in subsequently described in reference to FIGS. 3–6. After forming $TiO_xN_y$ layer 38, an interlayer dielectric (ILD) layer 40 is formed over semiconductor device 30 in accordance with conventional practices. A via opening 42 is formed within ILD layer 40 using conventional oxide etch chemistries. In accordance with the invention, during the formation of via 42, $TiO_xN_y$ layer 38 serves as a very effective etch-stop, such that during the etch of via 42, the etch will stop on or in $TiO_xN_y$ layer 38, without breaking into the underlying metallization layer 32.

FIGS. 3–6 illustrate a method for forming the titanium, titanium nitride, and $TiO_xN_y$ layer of semiconductor device 30 in accordance with a preferred embodiment of the present invention. Shown in FIG. 3 is a semiconductor device substrate 30 within a sputter deposition chamber 50. Semiconductor device 30 is placed within the chamber, along with a sputter target 52. In practicing the present invention, any type of sputter deposition tool may be suitable for depositing the various layers, with the Applied Materials Endura system being an example of one suitable tool. While only a portion of semiconductor device 30 is shown in FIGS. 3–6 for purposes of clarity, one of ordinary skill in the art will recognize that typically an entire wafer will be placed within the sputter deposition chamber of such tool.

Once a device is within the chamber, an argon plasma, represented in FIG. 3 by plasma 54, is generated. During a sputter deposition process, argon ions from plasma 54 hit target 52 and deposit the target material on to semiconductor device 30. In a first deposition step, a thin titanium layer 34 is deposited from a titanium target, being about 50 to 300 Å thick.

After depositing titanium layer 34, titanium nitride layer 36 is deposited on device 30 within the same deposition chamber 50, as shown in FIG. 4. To deposit titanium nitride film rather than a pure titanium film from the pure titanium target 52, a nitrogen gas 56 is introduced into the chamber along with the argon gas to form a nitrogen-argon plasma 56. Alternatively, nitrogen alone can be used. Positive ions from plasma 56 impinge upon target 52, but rather than pure titanium being deposited on substrate 30, the titanium atoms react with the nitrogen to form titanium nitride which is deposited onto the device. Deposition of titanium nitride is continued until the desired thickness is achieved. In a preferred embodiment of the present invention, titanium nitride layer 36 is deposited to a thickness between 400–1000 Å.

As FIG. 4 also shows, during the formation of titanium nitride layer 36, a titanium nitride layer 58 forms on target 52. This is the natural consequence of using a pure titanium target to deposit titanium nitride film using nitrogen gas. Not only will titanium nitride deposit on a semiconductor device but it will also form upon the titanium target. In prior art processes, titanium nitride layer 58 must be removed in order to process the next wafer within sputter deposition chamber 50. Since pure titanium is the first layer to be deposited within the chamber, titanium nitride layer 58 must be removed to expose the pure titanium target. Otherwise, deposition of titanium nitride will occur until the layer is completely removed, thereby, exposing the pure titanium target. One method for removing titanium nitride layer in the prior art is to use what is know as a "shutter disk" such as that provided with an Applied Materials Endura sputter deposition system. Alternatively, a sacrificial wafer could be used in place of the shutter disk. After depositing titanium and titanium nitride on one semiconductor substrate, the shutter disk is placed within deposition chamber 50, and titanium nitride layer 58 it sputtered off the target using argon plasma 54, and deposited onto the shutter disk. The shutter disk is then removed and the next semiconductor substrate is placed within the deposition chamber. A pure titanium film can then be deposited upon the next substrate.

Figure 5:
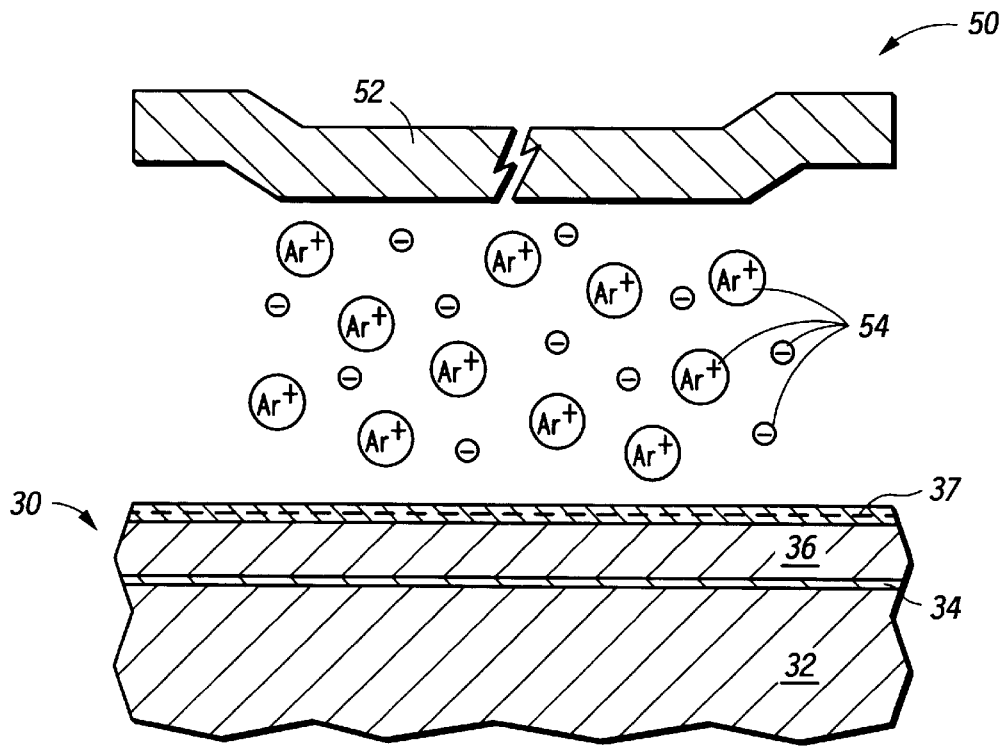

In accordance with the present invention, titanium nitride layer 58 which is formed on the target is actually used to form $TiO_xN_y$ layer 38. As shown in FIG. 5, semiconductor device 30 remains within deposition chamber 50 for formation a graded $TiN_y$ film 37, which will ultimately become $TiO_xN_y$ layer 38. After depositing the titanium nitride layer 36, the nitrogen gas flow is turned off, and only an argon plasma 54 remains. Argon ions from the argon plasma sputter away titanium nitride film 58 on target 52 causing deposition of titanium nitride onto semiconductor device 30. As the titanium nitride layer 58 is removed from target 52, the composition of the layer being deposited onto semiconductor device 30 changes, becoming richer in titanium as deposition progresses. In other words, as initially deposited, the layer will be nitrogen rich, with decreasing content of nitrogen through the thickness of the film, and so ultimately pure titanium is being deposited. In reference to FIG. 5, a graded TiN film 37 is deposited as a result of this process wherein the lower portion of the graded film is nitrogen rich, while the upper portion of the film is titanium rich. Because graded $TiN_y$ film 37 is formed on semiconductor device 30 in accordance with the present invention, the need to use the shutter disk or sacrificial wafer as was used in the prior art is eliminated, thereby reducing processing time.

Figure 6:
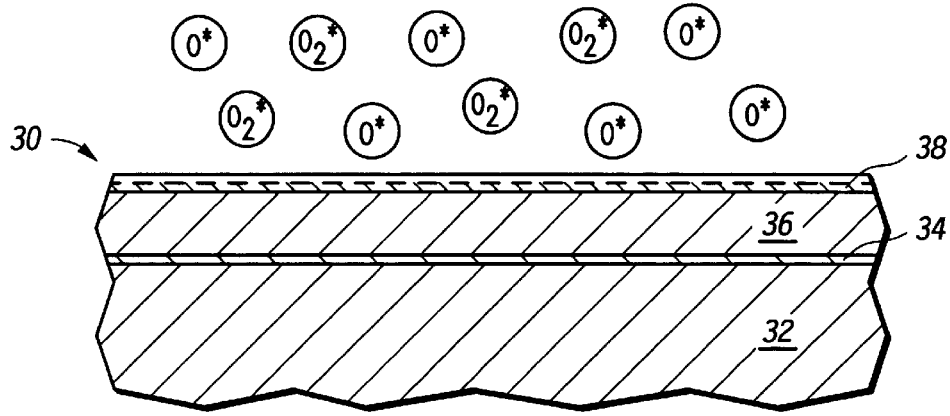
Figure 9:
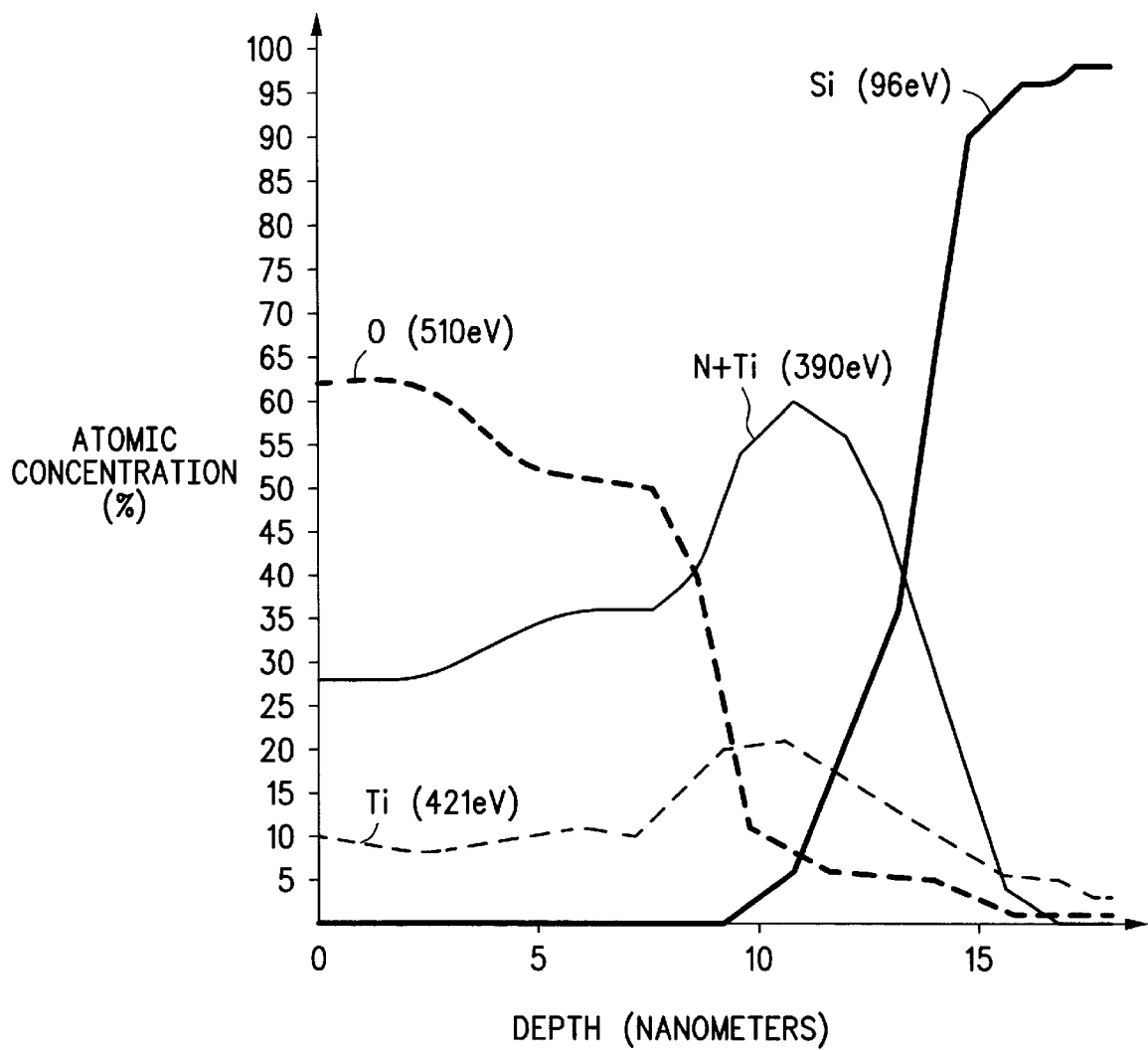
FIG. 9 is a Auger Electron Spectroscopy depth profile of a titanium oxy-nitride film formed in accordance with the present invention.

After forming graded $TiN_y$ 37, this layer is oxidized in a next step as illustrated in FIG. 6. Semiconductor device 30 is placed in an active oxygen environment which will convert a titanium rich portions of the graded $TiN_y$ layer 37 into titanium oxide. In one embodiment of the present invention, this oxidation process is achieved by performing a downstream $O_2$ plasma ash for 30–90 seconds. The oxidation is a self limiting reaction such that continued ashing will not produce additional titanium oxide. Another method for oxidizing the titanium is to expose the semiconductor device to ozone. A feature with the oxidation process is that it should not occur at temperatures which are incompatible with the underlying metallization. For example, when using aluminum, an oxidation process should be kept below 450° C. As shown in FIG. 6, $TiO_xN_y$ layer 38 is again divided into a lower and upper portion. Because the oxidation is a self-limiting step, and oxygen will not react with TiN, a lower portion of $TiO_xN_y$ layer 38 will be nitrogen rich, while the upper portion of the layer will be oxygen rich. An example of the composition of $TiO_xN_y$ layer 38 is shown in FIG. 9, which is an Auger Electron Spectroscopy (AES) depth profile of layer 38. As is shown in FIG. 9, the top most surface layer 38 is richer in oxygen than in nitrogen, while the bottom of the film (at approximately 150 Å) is richer in nitrogen. It is noted that the graph shown in FIG. 9 represents $TiO_xN_y$ layer which was formed directly on a silicon substrate. Accordingly, at depths greater than 150 Å, silicon is the only species being detected by AES.

The purpose of converting the graded $TiN_y$ 37 to a $TiO_xN_y$ layer 38 is three-fold. One reason is that titanium oxy-nitride will serve as a much more effective etch-stop layer than titanium nitride. A second reason is that titanium by itself is too reflective to serve as the upper most layer of the metalization. By converting the upper most titanium layer to $TiO_xN_y$, the reflectivity is greatly reduced, aiding in subsequent photolithography operations. Thirdly, by converting the titanium to titanium oxy-nitride, the upper most film is chemically stable for subsequent processing steps.

Figure 7:
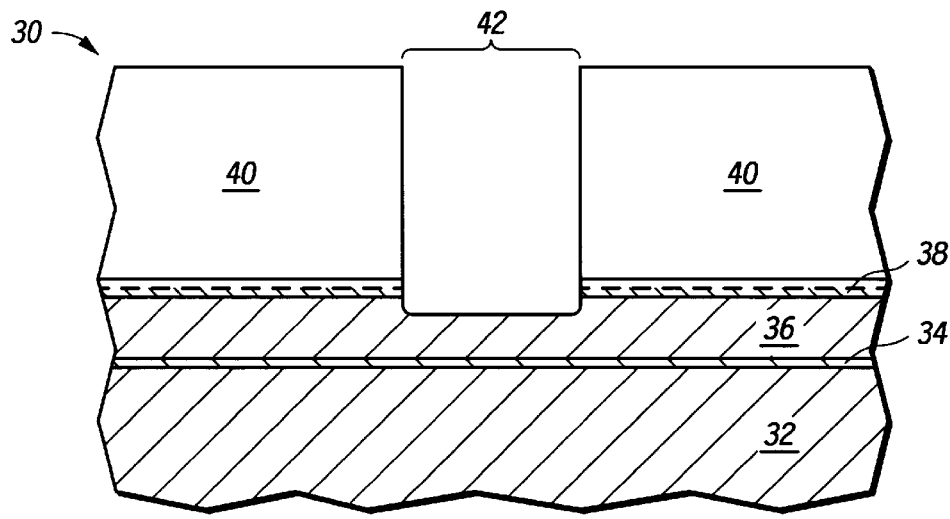
FIGS. 7–8 illustrate the semiconductor device of FIG. 2 as a plug material and a subsequent metallization layer is formed.

After forming $TiO_xN_y$ layer 38, semi-conductor device 30 can continue in the fabrication process in accordance with conventional practices. As illustrated in FIG. 7, an interlayer dielectric 40 is deposited over the device and via 42 is formed in ILD layer 40 in accordance with conventional practices. For example, a $CHF_3$ and argon chemistry, either with or without $CF_4$, can be used to form via 42 in ILD 40. In accordance with the present invention, the via etch stops on or in $TiO_xN_y$ layer 38 due to the selective nature of the etch chemistry to titanium oxy-nitride.

After forming via 42, the plug metalization is ready to be deposited within via 42. According to conventional practice, a via glue preclean is performed using an argon sputtering process. Traditionally, such a preclean is used to clean up the surface of the underlying titanium nitride film which is exposed at the bottom of via 42. In accordance with the present invention, the same argon sputter preclean can be used to remove $TiO_xN_y$ layer 38 from the bottom of via 42. Layer 38 is removed from the bottom of the via for sufficient contact to the underlying metallization. In accordance with the present invention, a removal of about 100 Å of $TiO_xN_y$ layer 38 results in adequate contact resistance. This number is likely to vary depending upon the time one sputters the titanium target in forming the graded $TiN_y$ layer 37. The longer such sputtering occurs, the more titanium will be on the surface of the device that needs to be removed. If the titanium layer is too thick, some titanium remains unoxidized, and it is undesireable to leave unreacted titanium along the sidewall because it is chemically unstable.

Figure 8:
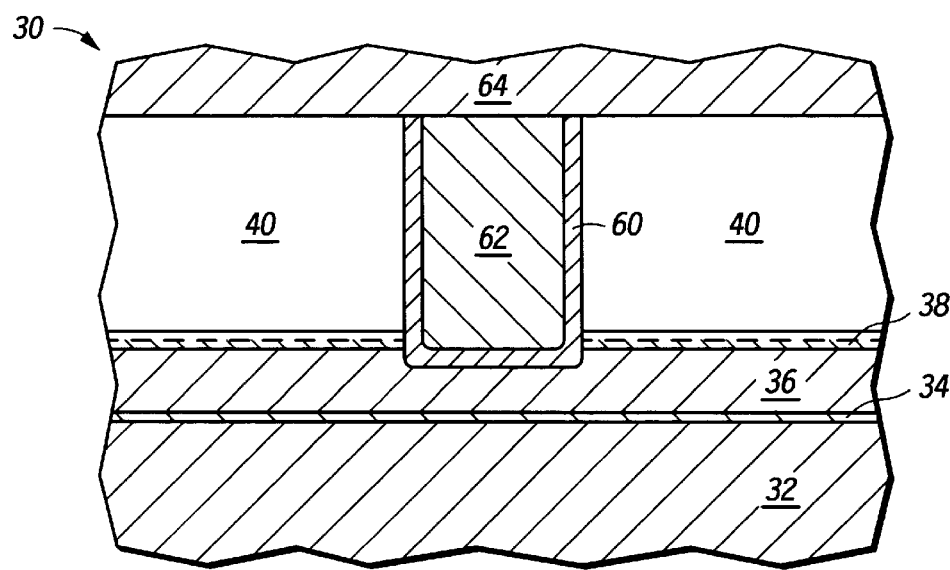

After the glue preclean, a glue layer 60 is deposited over semiconductor device 30. Initially, glue layer 60 will be deposited over ILD 40, and into via 42. Next the plug fill material 62 is deposited over the glue layer and into via 42. In a preferred embodiment, glue layer 60 is the titanium nitride layer while plug fill material 62 is tungsten. The tungsten and titanium nitride are then polished back to form a plug within via 42 as shown in FIG. 8. As a result of the polishing operation, glue layer 60 is removed from above ILD layer 40, leaving the glue layer within via 42 only. Following the polishing process, the subsequent metalization layer, such as metalization layer 64 is deposited over device 30. Processing of the device continues in accordance with conventional practices. For example, additional ILD layers and metalization layers will be deposited until ultimately passivation is performed and the device is packaged.

The forgoing descriptions and illustrations contained herein demonstrate many of the advantages associated with the present invention. In particular it has been revealed that use of a $TiO_xN_y$ layer results in a robust via etch process and fabricated semi-conductor devices. An ILD layer can be etched with great selectivity to the $TiO_xN_y$ layer, resulting in lower via resistance and higher distribution of via resistance. In a preferred embodiment, the etch rate ratio between the ILD layer and the transition metal oxynitride is greater than 45:1. Furthermore, use of the $TiO_xN_y$ layer allows a simple timed via etch process to be used, despite there being a wide variation in ILD thickness. Accordingly, the present invention is quite suitable for use in a processes utilizing chemical mechanical polishing in the interlayer dielectric. Moreover, use of the present invention actually increases throughput in the semiconductor manufacturing process. The most significant throughput enhancement is the fact that use of a shutter disk or sacrificial wafer in depositing titanium and TiN films in the same deposition chamber using a titanium target is completely eliminated. Accordingly, the 30 second to 60 second target cleaning process is eliminated between each wafer. Furthermore, use of the present invention enables a thinner TiN layer to be deposited as an ARC layer over the metallization, thereby reducing the deposition time of such film. A thinner TiN film also results in less film stress, and thereby lessens the probability of aluminum extruding into the via. A thinner TiN layer also reduces the amount of photoresist needed to pattern the underlying metalization layer, thereby saving material costs. Additionally, the present invention is achieved with no additional processing steps, if an $O_2$ ash is performed prior to depositing photoresist for deep ultra violet (DUV) lithography. Furthermore, the entire process can be performed at temperatures which are compatible with the underlying metalization scheme, for example below 450° C.

Thus it is apparent that there has been provided in accordance with the present invention, a method for forming vias in a semiconductor device that fully meets the needs and advantages set forth previously. Although the invention has been described and illustrated with reference to specific embodiments thereof, it is not intended that the invention be limited to the illustrative embodiments. Those skilled in the art will recognize that modifications and variations can be made without departing from the spirit of the invention. For example, the processes previously described can be practiced in conjunction with the use of tantalum films or films of other transition metals. Furthermore, the present invention is not limited to the particular methods for oxidizying the film as those described. For example, wet chemistries can be used to oxidize the film. Furthermore, a wet etch chemistry can be used to remove the oxidized film from within the via opening. Furthermore, any type of sputtering can be used to remove the oxidized film from within the via opening. Therefore, it is intended that this invention encompass all such variations and modifications that fall within the scope of the intended claims.

We claim:

1. A process for fabricating a semiconductor device comprising:

providing a conductive substrate;

depositing a first layer on the conductive substrate, the first layer comprising a first material;

depositing a second layer on the first layer from a target, the second layer comprising a second material, wherein:

the second layer is different from the first layer; and the target is coated with the second material;

depositing a third layer on the second layer from the coated target, the third layer being graded with increased content of the second material toward the second layer and increased content of the first material away from the second layer;

oxidizing the third layer;

depositing a fourth layer on the third layer; and forming at least one via selectively through the fourth layer to the third layer, wherein the at least one via exposes a portion of the oxidized third layer.

2. The process of claim 1 wherein the first material includes a transition metal material.

3. The process of claim 1 further comprising removing the exposed portion of the oxidized third layer.

4. The process of claim 1 wherein the conductive substrate includes an aluminum material.

5. The process of claim 1 wherein the conductive substrate includes a transition metal material.

6. The process of claim 1 wherein:

the fourth layer is an interlayer dielectric layer; and while forming the at least one via, an etch chemistry is used, wherein an etch rate ratio of the third layer to the fourth layer is greater than 40:1.

7. The process of claim 1 wherein oxidizing comprises:

activating oxygen in a plasma environment; and flowing the oxygen downstream to oxidize the third layer.

8. The process of claim 1 wherein oxidizing is performed in a wet chemical environment.

9. The process of claim 1 wherein oxidizing is performed in an ozone environment.

10. The process of claim 1 wherein oxidizing is performed at a temperature below which the conductive substrate melts.

11. The process of claim 10 wherein the temperature is no greater than 450° C.

12. The process of claim 1 wherein removing the exposed portion comprises sputtering in a plasma environment.

13. The process of claim 1 wherein removing the exposed portion is performed in a wet chemical environment.

14. The process of claim 1 wherein the conductive substrate includes copper.

15. The process of claim 14, wherein the first material includes tantalum.

16. A process for fabricating a semiconductor device comprising:

providing a substrate having a metal interconnect;

depositing a first layer on the substrate, the first layer comprising a first material;

oxidizing a top portion of the first layer, the top portion is graded with increased oxygen content away from the substrate, wherein oxidizing is performed at no greater than 450° C.;

depositing a second layer on the top portion of the first layer; and forming a via selectively through the second layer to the top portion of the first layer, wherein in forming the via, an etch chemistry is used wherein etching stops within the top portion of the first layer.

17. The process of claim 16 wherein the first material includes a transition metal material.

18. The process of claim 16 wherein the metal interconnect includes an aluminum material.

19. The process of claim 16 wherein the second layer is an interlayer dielectric layer of a semiconductor device.

20. The process of claim 16 wherein oxidizing comprises:

activating oxygen in a plasma environment; and flowing the oxygen downstream to the first layer.

21. The process of claim 16 wherein oxidizing is performed in a wet chemical environment.

22. The process of claim 16 wherein oxidizing is performed in an ozone environment.

23. The process of claim 16 further comprising:

after forming the via removing an exposed part of the top portion of the first layer.

24. The process of claim 23 wherein removing the exposed part comprises sputtering in a plasma environment.

25. The process of claim 23 wherein removing the exposed part is performed in a wet chemical environment.

26. The process of claim 16, wherein the metal interconnect includes copper.

27. The process of claim 26, wherein the first material includes tantalum.

28. A process for fabricating a semiconductor device comprising:

providing a semiconductor substrate having a metallization layer;

depositing a transition metal nitride layer on the metallization layer;

depositing a transition metal layer on the transition metal nitride layer, wherein the transition metal layer is graded with increased content of transition metal nitride toward the transition metal nitride layer and increased content of transition metal material away from the transition metal nitride layer;

oxidizing at least a portion of the transition metal layer to form a transition metal oxide layer;

depositing an interlayer dielectric layer on the transition metal oxide layer;

exposing the transition metal oxide layer by forming a via through the interlayer dielectric layer;

removing an exposed portion of the transition metal oxide layer; and forming a conductive plug in the via.

29. The process of claim 28 wherein the transition metal oxide layer includes titanium and oxygen.

30. The process of claim 29 wherein transition metal oxide layer further includes nitrogen.

31. The process of claim 28 wherein the metallization layer includes an aluminum material.

32. The process of claim 28 wherein the metallization layer includes copper.

33. The process of claim 28 wherein oxidizing is performed in a wet chemical environment.

34. The process of claim 28 wherein oxidizing is performed in an ozone environment.

35. The process of claim 28 wherein oxidizing comprises performing an oxygen plasma downstream ash operation.

36. The process of claim 28 wherein the oxidizing is performed at a temperature is no greater than 450° C.

37. The process of claim 28 wherein removing the exposed portion comprises sputtering in a plasma environment.

38. The process of claim 28 wherein removing the exposed portion is performed in a wet chemical environment.

39. The process of claim 28 wherein the transition metal is tantalum.

40. The process of claim 28 wherein the transition metal is titanium.

* * * * *